(12) United States Patent
Hasegawa (10) Patent No.: US 9,823,302 B2
(45) Date of Patent: Nov. 21, 2017

(54) SEMICONDUCTOR CIRCUIT AND SEMICONDUCTOR SYSTEM

(71) Applicant: Kabushiki Kaisha Toshiba, Minato-ku, Tokyo (JP)

(72) Inventor: Jun Hasegawa, Yokohama Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 71 days.

(21) Appl. No.: 15/066,375

(22) Filed: Mar. 10, 2016

(65) Prior Publication Data

US 2017/0074931 A1 Mar. 16, 2017

(30) Foreign Application Priority Data

Sep. 14, 2015 (JP) ................................. 2015-181215

(51) Int. Cl.
*G01R 31/317* (2006.01)
*G06F 11/16* (2006.01)

(52) U.S. Cl.
CPC ........ *G01R 31/31703* (2013.01); *G06F 11/16* (2013.01)

(58) Field of Classification Search
CPC .. G01R 31/31703; G11C 29/38; G11C 29/52; G06F 11/16
See application file for complete search history.

(56) References Cited

U.S. PATENT DOCUMENTS

| 5,239,641 A | 8/1993 | Horst | |
|---|---|---|---|
| 6,359,818 B2 * | 3/2002 | Suzuki | G11C 29/44 365/189.12 |
| 7,653,854 B2 * | 1/2010 | Anzou | G11C 29/16 714/733 |
| 2014/0258797 A1 * | 9/2014 | Gorman | G11C 29/40 714/719 |

FOREIGN PATENT DOCUMENTS

| JP | 2004-340877 A | 12/2004 |
|---|---|---|
| JP | 2008-026074 A | 2/2008 |

* cited by examiner

*Primary Examiner* — Shelly A Chase
(74) *Attorney, Agent, or Firm* — White & Case LLP (57) ABSTRACT

A semiconductor circuit has circuit units in a plurality of stages which units are continuously connected, each of the circuit units in the plurality of stages including: a first register; a second register; a first outputter; and a second outputter. The first outputter is connected to the first register and the second register, and selects and outputs one of a first input signal inputted from the first register and a second input signal inputted from the second register. The second outputter outputs at least one of the second input signal and a third input signal to a second register in a next stage, the third input signal being outputted from a logic circuit unit that performs logic operation on the basis of an input signal containing at least one of a signals outputted from the first outputters.

15 Claims, 5 Drawing Sheets

SEMICONDUCTOR CIRCUIT AND SEMICONDUCTOR SYSTEM

CROSS REFERENCE TO RELATED APPLICATIONS

This application is based upon and claims the benefit of priority from the prior Japanese Patent Application No. 2015-181,215, filed on Sep. 14, 2015, the entire contents of which are incorporated herein by reference.

FIELD

Embodiments of the present invention relate to a semiconductor circuit and a semiconductor system.

BACKGROUND OF THE INVENTION

In the fields where high safety is required, it is required to monitor a function normally operating during its operation. Therefore, the function is duplexed into an operation system and a safety system on a function-by-function basis, such as a module-by-module basis. The operation is monitored by comparing the outputs of those with each other. In this method, the combination circuit except the registers is also needed to be duplexed entirely, which causes the circuit scale to be twice as large or more.

Moreover, there can be a case where common cause failure (for example, occurrence of delay due to temperature variation) arises in the operation system and in the safety system. In such a case, there can be a case where the outputs coincide with each other in the operation system and in the safety system, which causes a possibility that the failure cannot be detected.

DETAILED DESCRIPTION OF THE INVENTION

Embodiments will now be explained with reference to the accompanying drawings. The present invention is not limited to the embodiments.

There is provided a semiconductor circuit according to the present embodiment which has circuit units in a plurality of stages, the circuit units being continuously connected, and each of the circuit units in the plurality of stages comprising: a first register; a second register; a first outputter; and a second outputter. The first outputter is connected to the first register and the second register, and outputs at least one of a first input signal inputted from the first register and a second input signal inputted from the second register. The second outputter configured to output at least one of the second input signal and a third input signal to a second register in a next stage, the third input signal being outputted from a logic circuit unit that performs logic operation on the basis of an input signal containing at least one of signals outputted from the first outputters.

The semiconductor circuit according to the present embodiment is to enhance the detection rate of failure more by inputting a diagnosis signal to the logic circuit unit as a diagnosis target and comparing a value of the result signal with an expectation value.

Figure 1:
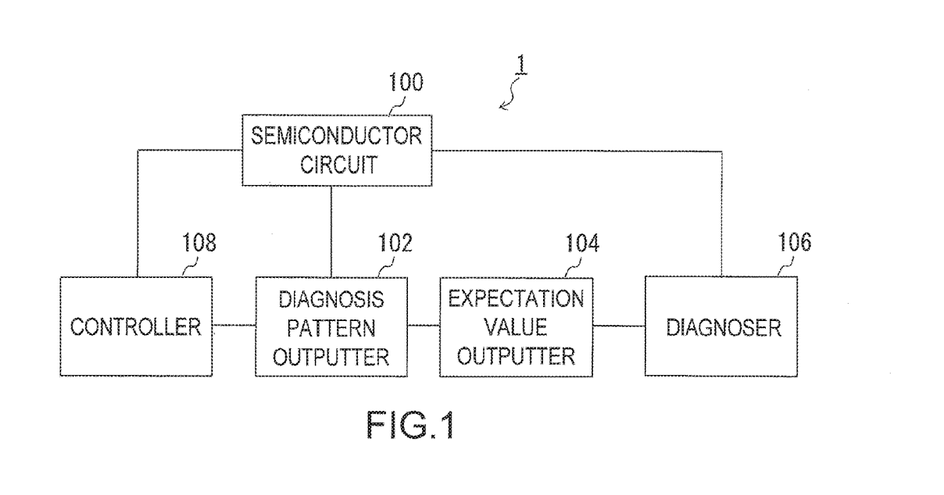
FIG. 1 is a block diagram for explaining a configuration of a semiconductor system according to the present embodiment.

FIG. 1 is a block diagram for explaining a configuration of a semiconductor system 1 according to a first embodiment. The semiconductor system 1 according to the present embodiment is configured to include a semiconductor circuit 100, a diagnosis pattern outputter 102, an expectation value outputter 104, a diagnoser 106 and a controller 108.

The semiconductor circuit 100 is a circuit having a diagnosis function. Namely, the semiconductor circuit 100 has a circuit structure with which a diagnosis signal can be inputted to a circuit unit as a diagnosis target, and whether or not the circuit unit is good can be diagnosed on the basis of a value of an output signal of the circuit unit and an expectation value thereof.

The diagnosis pattern outputter 102 outputs the diagnosis signal for diagnosing the presence or absence of failure. The diagnosis pattern outputter 102 outputs, for example, a preset diagnosis pattern as the diagnosis signal to the semiconductor circuit 100.

The expectation value outputter 104 outputs the expectation value corresponding to the diagnosis pattern. Namely, the expectation value outputter 104 outputs the expectation value as a theoretical value that the circuit unit should output on the basis of the diagnosis pattern. For example, the expectation value is a value beforehand calculated based on the diagnosis signal.

The diagnoser 106 diagnoses whether or not the circuit failures by comparing the value of the output signal from the circuit unit as the diagnosis target with the expectation value from the expectation value outputter 104. Namely, ii is detected whether or not the circuit failures on the basis of whether the output signal exactly as the expectation value is outputted.

The controller 108 controls the semiconductor circuit 100, the diagnosis pattern outputter 102, the expectation value outputter 104 and the diagnoser 106. Namely, the controller 108 includes not-shown clock outputter and control signal outputter. The clock outputter outputs a clock control signal. Moreover, the control signal outputter outputs a control signal.

Figure 2:
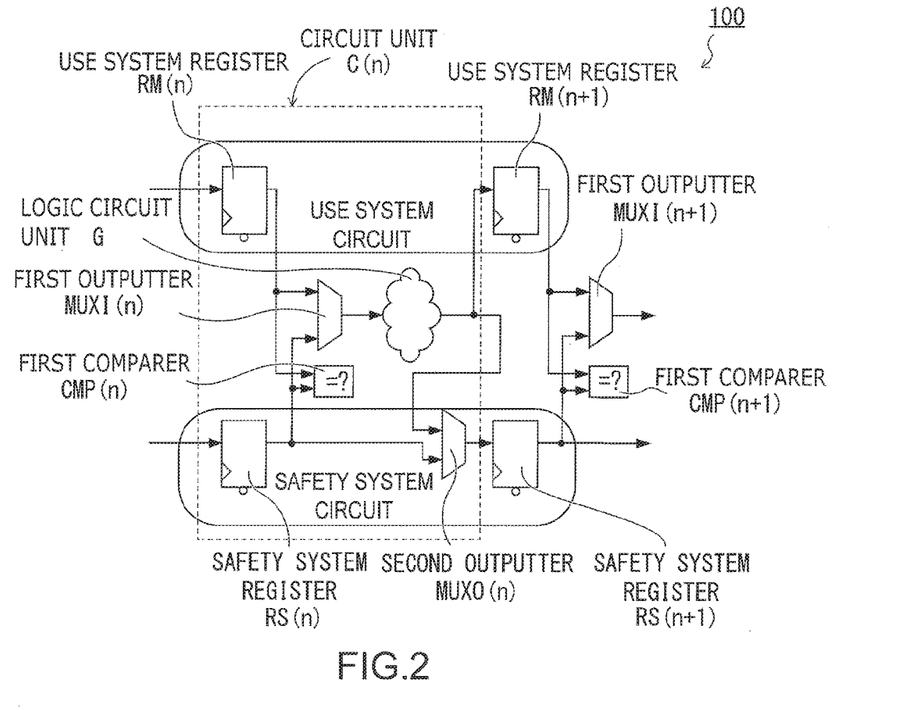
FIG. 2 is a block diagram illustrating a configuration of a semiconductor circuit.

Moreover, the semiconductor circuit 100 and the clock outputter in the controller 108 may be configured in the same semiconductor chip. Furthermore, the diagnosis pattern outputter 102, the expectation value outputter 104, the diagnoser 106 and the control signal outputter in the controller 108 may be configured in the same semiconductor chip likewise. Otherwise, the diagnosis pattern outputter 102, the expectation value outputter 104, the diagnoser 106 and the control signal outputter in the controller 108 may be configured outside the semiconductor chip containing the semiconductor circuit 100. FIG. 2 is a block diagram illustrating a configuration of the semiconductor circuit 100. The semiconductor circuit 100 is configured to have circuit units "C(n)" (0≤n<m) connected. "m" is an integer not less than two and has, for example, figures of ten or tens of thousands. The circuit unit "C(0)" in the first stage is connected via an outputter in the previous stage. The circuit unit "C(m−1)" in the final stage is connected to the outside. The circuit units "C(n)" are equivalently configured except for the connection targets of the input of the circuit unit "C(0)" and the output of the circuit unit "C(m−1)". Here, a configuration of the circuit unit "C(n)" (1≤n<m−1) is described.

The circuit unit "C(n)" is configured to include an operation system register "RM(n)" (first register), a safety system register "RS(n)" (second register), a first outputter "MUXI(n)", a logic circuit unit "G", a second outputter "MUXO(n)" and a first comparer "CMP(n)".

The operation system register "RM(n)" holds and outputs an input signal in accordance with a control clock signal from the controller 108. Namely, the operation system register "RM(n)" is configured of a flip-flop or the like.

The safety system register "RS(n)" has the equivalent configuration to the operation system register "RM(n)" and is configured, for example, of a flip-flop or the like. When the safety system registers "RS" in a plurality of stages are connected, they function as a shift register.

The first outputter "MUXI(n)" is connected to the operation system register "RM(n)" and the safety system register "RS(n)", and selects and outputs one of the input signal (first input signal) from the operation system register "RM(n)" and the input signal (second input signal) from the safety system register "RS(n)". Namely, the first outputter "MUXI(n)" is, for example, a multiplexer.

The logic circuit unit "G" is connected to the first outputter "MUXI(n)", performs logic operation on the basis of a plurality of input signals containing the input signal from the first outputter "MUXI(n)", and outputs one of a plurality of outputs to the operation system register "RM(n+1)" in the next stage. Namely, the logic circuit unit "G" is a circuit unit with which the plurality of output signals are generated with respect to the plurality of input signals. The logic circuit unit "G" is configured, for example, of a combination circuit and shared by the circuit units "C(n)". The second outputter "MUXO(n)" is connected to the logic circuit unit "G" and the safety system register "RS(n)", and selects and outputs one of the input signal (third input signal) from the logic circuit unit "G" and the input signal from the safety system register "RS(n)" to the safety system register "RS(n+1)" in the next stage. Namely, the second outputter "MUXO(n)" is, for example, a multiplexer.

The first comparer "CMP(n)" is connected to the operation system register "RM(n)" and the safety system register "RS(n)" and compares the first register value in the operation system register "RM(n)" with the second register value of the safety system register "RS(n)". Namely, when the first register value does not coincide with the second register value, the first comparer "CMP(n)" outputs a non-coincidence signal. In this way, in the case of non-coincidence, the first comparer "CMP(n)" reports this as transition fault.

Figure 3:
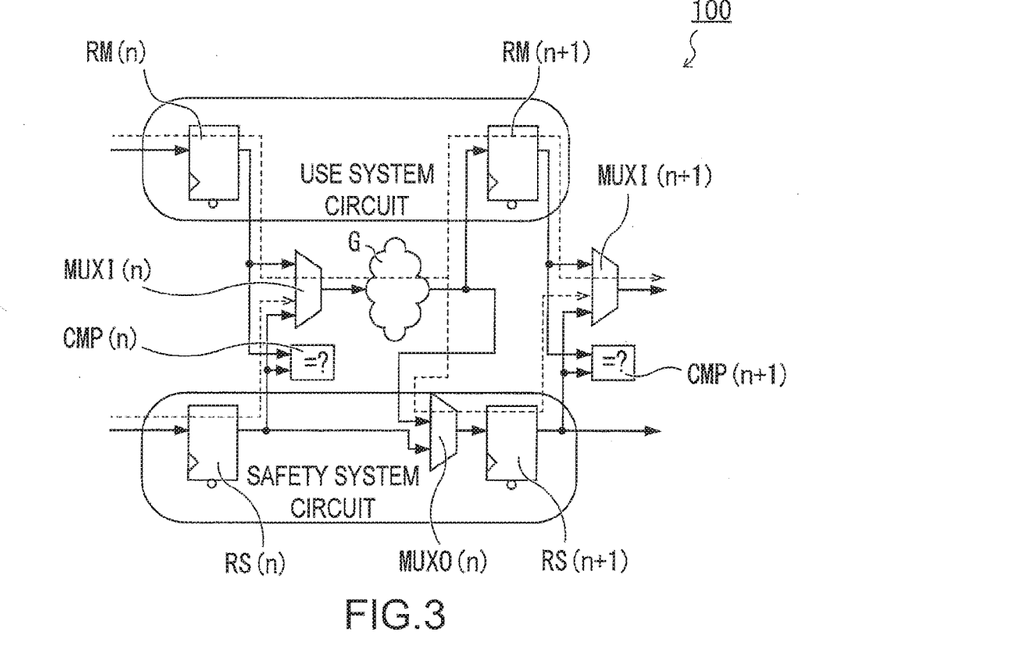
FIG. 3 is a block diagram for explaining operation of the semiconductor circuit in normal use.

Next, operation of the semiconductor circuit 100 in normal use is described. FIG. 3 is a block diagram for explaining the operation of the semiconductor circuit 100 in normal use. In FIG. 3, broken lines indicate flows of signals.

In normal use, the same signal is inputted to the operation system register "RM(n+1)" and the safety system register "RS(n+1)". Namely, in normal use, the first outputter "MUXI(n)" selects and outputs the input signal from the operation system register "RM(n)" to the logic circuit unit "G". Moreover, the second outputter "MUXO(n)" selects and outputs the input signal from the logic circuit unit "G" to the safety system register "RS(n+1)" in the next stage.

When non-coincidence arises between the output signals of the operation system register "RM(n+1)" and the safety system register "RS(n+1)", the first comparer "CMP(n+1)" outputs the non-coincidence signal. Namely, in the state where the input signal from the operation system register "RM(n)" is selected in the first outputter "MUXI(n)", one (third input signal) of the output signals of the logic circuit unit "G" is inputted to the operation system register "RM(n+1)" and the safety system register "RS(n+1)".

Figure 4:
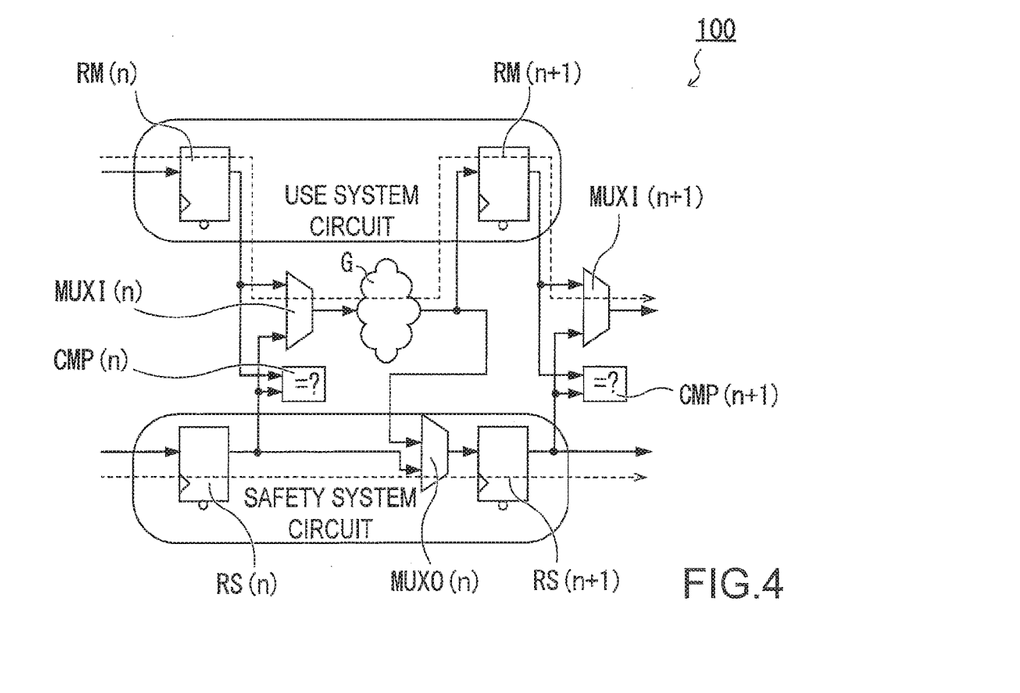
FIG. 4 is a block diagram for explaining operation of the semiconductor circuit in configuring a diagnosis value.

Next, operation of the semiconductor circuit 100 in configuring a diagnosis value is described. FIG. 4 is a block diagram for explaining the operation of the semiconductor circuit 100 in configuring the diagnosis value. In FIG. 4, broken lines indicate flows of signals.

In configuring the diagnosis value, the first outputter "MUXI(n)" selects and outputs the input signal from the operation system register "RM(n)" to the logic circuit unit "G". Moreover, the second outputter "MUXO(n)" selects and outputs the input signal from the safety system register "RS(n)" to the safety system register "RS(n+1)".

Namely, the input signal from the operation system register "RM(n)" is selected in the first outputter "MUXI(n)" and one of the output signals of the logic circuit unit "G" is inputted to the operation system register "RM(n)".

Moreover, in the state where the input signal from the safety system register "RS(n)" is selected in the second outputter "MUXO(n)", the diagnosis signal is inputted to "RS(0)" in the first stage as the safety system register from the diagnosis pattern outputter 102 in a serial manner. In this case, the safety system registers "RS(n)" are configured into a chain connection as a shift register. In other words, the diagnosis signal is configured up to "RS(m−1)" using time for "m" clock pulses. An outputter "MUXO" which is equivalent to the second outputter "MUXO(n)" is connected to the previous stage of the safety system register "RS(0)". This "MUXO" switches and outputs the diagnosis signal from the diagnosis pattern outputter 102 and the output signal of the logic circuit "G" to the safety system register "RS(0)". Namely, "MUXO" takes the safety system register "RS(0)" as the input start point of the diagnosis signal when the output of the diagnosis signal is selected. Meanwhile, "MUXO" selects and outputs the output signal of the logic circuit "G" to the safety system register "RS(0)" in normal use.

On the other hand, also in configuring the diagnosis value, the operation system register "RM(n)" performs the same operation as in normal use. Due to this, also in configuring the diagnosis value, the semiconductor circuit 100 can continue the normal operation.

Figure 5:
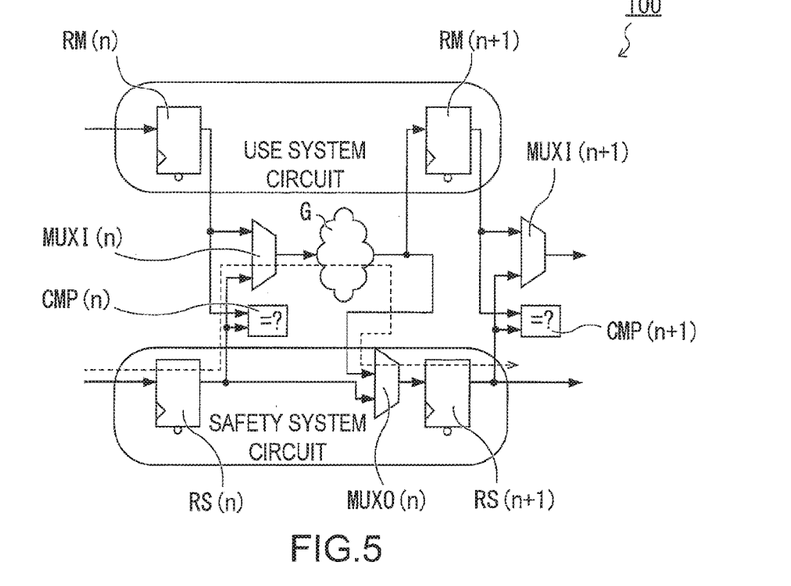
FIG. 5 is a block diagram for explaining operation of the semiconductor circuit in diagnosis.

Next, operation of the semiconductor circuit 100 in diagnosis is described. FIG. 5 is a block diagram for explaining the operation of the semiconductor circuit 100 in diagnosis. Broken lines indicate flows of signals.

In diagnosis, the first outputter "MUXI(n)" selects and outputs the input signal from the safety system register "RS(n)" to the logic circuit unit "G". Moreover, the second outputter "MUXO(n)" selects and outputs the input signal from the logic circuit unit "G" to the safety system register "RS(n+1)". Namely, the result signal is outputted as one of a number of outputs outputted based on the diagnosis signal by the logic circuit unit "G" to the safety system register "RS(n+1)" in the next stage.

In this stage, in timing when the first outputter "MUXI(n)" selects the input signal from the safety system register "RS(n)", the controller 108 suspends the clock of the operation system register "RM(n)". In this case, while the clock signal is being supplied to the safety system register "RS(n)", supply of the clock signal to the operation system register "RM(n)" is suspended. Moreover, after the diagnosis signal is configured as the diagnosis pattern to the safety system register "RS(n)", the controller 108 changes the selections of the output signals of the first outputter "MUXI(n)" and the second outputter "MUXO(n)".

Next, transmission of the result signal is described with reference to FIG. 4. In the case of transmitting the result signal, the first outputter "MUXI(n)" selects and outputs the input signal from the operation system register "RM(n)" to the logic circuit unit "G". Moreover, the second outputter "MUXO(n)" selects and outputs the input signal from the safety system register "RS(n)" to the safety system register "RS(n+1)". Namely, the safety system registers "RS(n)" are connected again into the chain connection as the shift register.

Meanwhile, in timing when the first outputter "MUXI(n)" selects the input signal from the operation system register "RM(n)", the controller 108 starts supply of the clock control signal to the operation system register "RM(n)". By doing so, also in transmitting the result signal, the operation system register "RM(n)" can perform the same operation as in normal use. Due to this, also in transmitting the result signal, the semiconductor circuit 100 can continue the normal operation.

Next, in timing when the result signal is transmitted from each safety system register "RS(n)" and the result signal is outputted from the safety system register "RS(m−1)", each of the second outputters "MUXO(n)" is set in the state where the input signal from the logic circuit unit "G" is selected. In this way, the semiconductor circuit 100 returns to the normal state.

Next, upon output of the result signal from "RS(m−1)" which is the safety system register in the final stage, the diagnoser 106 compares it with the expectation value acquired from the expectation value outputter 104. When the value of the result signal is different from the expectation value, the diagnoser 106 determines that the logic circuit unit "G" failures. On the other hand, when the value of the result signal is the same as the expectation value, it determines that the logic circuit unit "G" is good.

Figure 6:
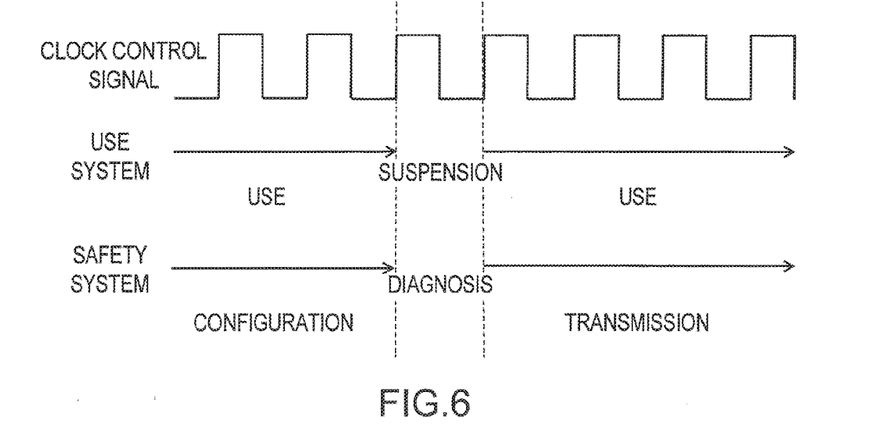
FIG. 6 is a schematic diagram for explaining relation between the states of registers and a clock control signal.

Next, the states of the operation system register "RM(n)" and the safety system register "RS(n)" are described based on relation between those and timing of the clock control signal. FIG. 6 is a schematic diagram for explaining the relation between the states of the resisters and the clock control signal. The middle row thereof illustrates the state of the operation system register "RM(n)". The bottom row thereof illustrates the state of the safety system register "RS(n)".

During the period when the safety system register "RS(n)" is performing the configuring work of the diagnosis value, the operation system register "RM(n)" is performing the normal operating work. During the period when the safety system register "RS(n)" is performing the diagnosis operation, the supply of the clock to the operation system register "RM(n)" is suspended and its use is thus suspended. Moreover, during the period when the safety system register "RS(n)" is performing the transmission of the result signal, the operation system register "RM(n)" is performing the normal operating work. Namely, the suspension of the normal operating work of the operation system register "RM(n)" is only during the period of the diagnosis. The clock in diagnosis corresponds, for example, to one clock pulse. Notably, it may correspond to plural clock pulses such as two or three.

As above, in the present embodiment, the diagnosis of failure due to a common cause can be performed with respect to the circuit itself that serves the use. The failure due to a common cause can be detected. Moreover, since the safety system registers "RS(n)" are used for the configuration of the diagnosis signal, the operation system registers "RM(n)" can continue the normal operating work. In this way, the semiconductor circuit 100 is only needed to suspend the normal use for a time corresponding to the clock pulses with which the diagnosis signal is transmitted to the circuit as the diagnosis target.

Moreover, although the portion of the registers is duplexed, the individual duplexed registers share the logic circuit unit. Due to this, as compared with duplication on a module-by-module basis, the circuit scale can be reduced more. Furthermore, even in the case of a circuit without a functional safety measure, the functional safety measure can be easily applied thereto, for example, by changing an existing register chain thereof which is installed for the purpose of scanning into the configuration of the present invention.

Notably, when the diagnosis signal is outputted to the operation circuit as the diagnosis target, "MUXI(n)" may be caused to output a fixed value in place of inputting the diagnosis signal from the safety system register "RS(n)". Moreover, while the result signal is outputted to the outside in evaluating the result signal, the diagnosis signal may be set as a fixed value to compare a preset expectation value with the result signal in the semiconductor circuit 100, and only the result thereof may be reported to the outside of the semiconductor circuit 100. Moreover, when the serial input and output are not performed in configuring the diagnosis value and in transmitting the result signal, the chain structure is not needed to be employed.

Modification 1

Figure 7:
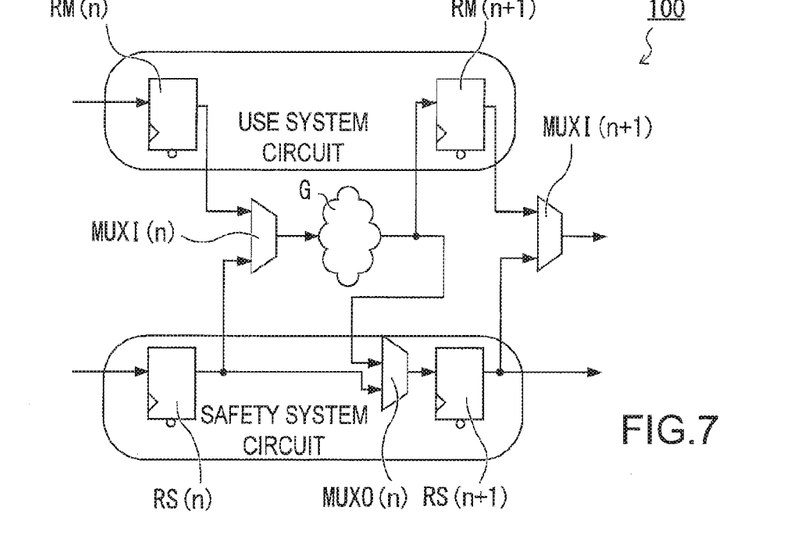
FIG. 7 is a block diagram illustrating Modification 1 of the semiconductor circuit 100.

FIG. 7 is a block diagram illustrating Modification 1 of the semiconductor circuit 100. In Modification 1, the detection of the transition failure is not performed in the semiconductor circuit 100, and thereby, the circuit scale is to be reduced more. Therefore, it is different from the semiconductor circuit 100 of FIG. 2 in not having the first comparers "CMP(n)". In this way, the circuit scale can be reduced more.

Modification 2

Figure 8:
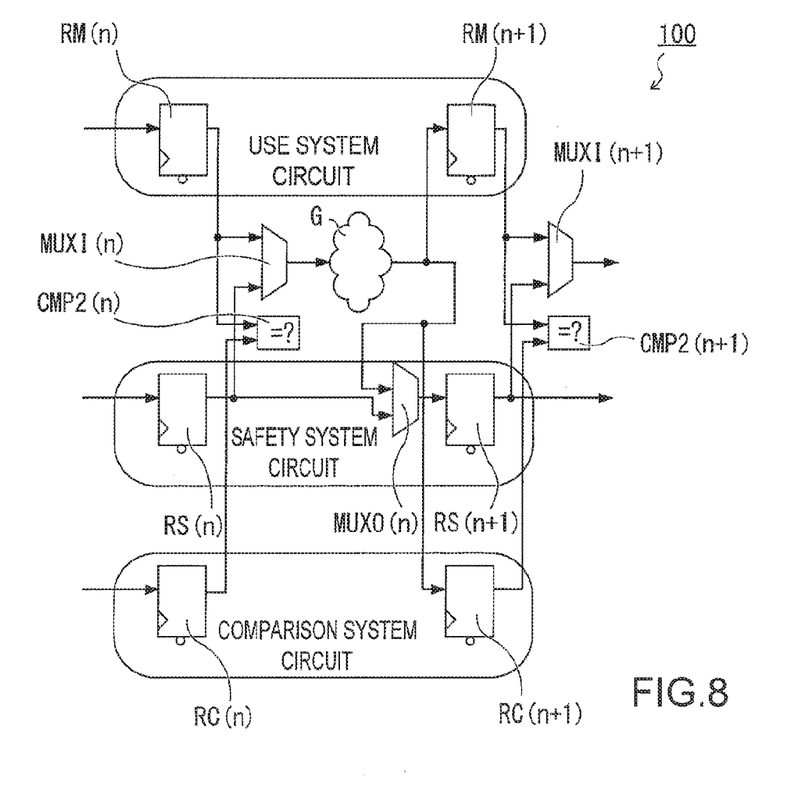
FIG. 8 is a block diagram illustrating Modification 2 of the semiconductor circuit 100.

FIG. 8 is a block diagram illustrating Modification 2 of the semiconductor circuit 100. Modification 2 is different from the semiconductor circuit 100 of FIG. 2 in including comparison system registers "RC(n)" ($0 \leq n < m$) (third registers). Hereafter, the different portions from the semiconductor circuit 100 in FIG. 2 are described.

The second comparer "CMP2(n)" is connected to the operation system register "RM(n)" and the comparison system register "RC(n)" and compares the first register value in the operation system register "RM(n)" with the third register value of the comparison system register "RC(n)". Namely, when the first register value does not coincide with the second register value, the second comparer "CMP2(n)" outputs the non-coincidence signal. In the case of non-coincidence, the second comparer "CMP2(n)" reports this as the transition failure.

Namely, even when the semiconductor circuit 100 is in the operation state such as the configuring work of the diagnosis value, the operation system register "RM(n)" can be compared with the comparison system register "RC(n)". In this way, the transition failure of the operation system register "RM(n)" can be monitored at all times.

Modification 3

Figure 9:
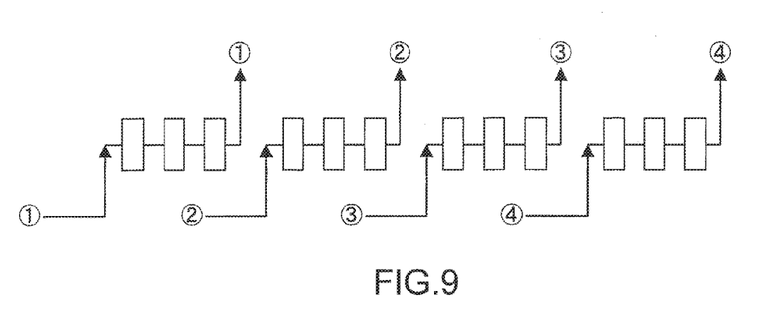
FIG. 9 is a diagram schematically illustrating Modification 3 of the semiconductor circuit 100.

FIG. 9 is a diagram schematically illustrating Modification 3 of the semiconductor circuit 100. In FIG. 9, rectangles indicate the safety system registers "RS(n)". Moreover, FIGS. (1) to (4) indicate positions at which the diagnosis signal is divided and inputted in a parallel manner and positions at which the result signals are taken out in a parallel manner with directions of arrows reversed.

For example, the arrow (1) toward the safety system register "RS(n)" indicates the safety system register "RS(n)" to which the divided diagnosis signal is inputted. Moreover, the arrow (2) indicates the safety system register "RS(n+3)" to which the diagnosis signal is inputted. Meanwhile, the reversed arrows indicate the positions at which the result signal is divided and taken out. The diagnosis signal is divided and is inputted and outputted in a parallel manner, and thereby, the diagnosis value can be configured at a higher speed. Moreover, the result signal can be taken out at a higher speed.

As mentioned above, according to the semiconductor circuit 100 according to the present embodiment, the diagnosis signal is outputted to the logic circuit unit "G" via the safety system register "RS(n)" and the result signal obtained from the logic circuit unit "G" is compared with the expectation value, and thereby, it is diagnosed whether or not the diagnoser 106 failures. By doing so, while the suspension time of the operation system register "RM(n)" is reduced more, the operation state of the logic circuit unit "G" that is actually implemented can be diagnosed. Hence, the detection rate of failure can be made higher. Moreover, since the operation system register "RM(n)" and the safety system register "RS(n)" are connected to the logic circuit unit "G", the logic circuit unit "G" is not needed to be duplexed, which can reduce the circuit scale more.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A semiconductor circuit has circuit units in a plurality of stages, the circuit units being continuously connected, and each of the circuit units in the plurality of stages comprising:
    a first register;
    a second register corresponding to the first register;
    a first outputter that is connected to the first register and the second register, and outputs at least one of a first input signal from the first register and a second input signal from the second register; and
    a second outputter configured to output at least one of the second input signal and a third input signal to a second register in a next stage, the third input signal being outputted from a logic circuit unit that performs logic operation on the basis of an input signal containing at least one of signals outputted from the first outputters.

2. The semiconductor circuit according to claim 1, wherein
    when a diagnosis signal is inputted to the second register in a state where the first input signal is selected in the first outputter and the second input signal is selected in the second outputter,
    after a diagnosis value based on the diagnosis signal is set in the second register, supply of a clock signal to the first register is suspended, the second input signal is selected in the first outputter, and the third input signal is selected in the second outputter to perform diagnosis of the logic circuit unit.

3. The semiconductor circuit according to claim 2, wherein after a result signal based on the diagnosis signal is inputted from the logic circuit unit to the second register in the next stage, the clock signal is supplied to the first register.

4. The semiconductor circuit according to claim 3, wherein before the clock signal is supplied, the first input signal is selected in the first outputter and the second input signal is selected in the second outputter.

5. The semiconductor circuit according to claim 1, wherein the first input signal is selected in the first outputter and the third input signal is inputted to the first register in the next stage in the second outputter.

6. A semiconductor system has circuit units in a plurality of stages, the circuit units being continuously connected, each of the circuit units in the plurality of stages including:
    a first register;
    a second register corresponding to the first register;
    a first outputter that is connected to the first register and the second register, and outputs at least one of a first input signal from the first register and a second input signal from the second register; and
    a second outputter configured to outputs at least one of the second input signal and a third input signal to a second register in a next stage, the third input signal being outputted from a logic circuit unit that performs logic operation on the basis of an input signal containing at least one of signals outputted from the first outputters.

7. The semiconductor system according to claim 6, further comprising
    a diagnosis pattern outputter that outputs a diagnosis signal as a diagnosis pattern to a first stage of the second register in a serial manner, wherein
    in a state where the first input signal is selected in the first outputter and the second input signal is selected in the second outputter,
    the third input signal is inputted to the first register and the diagnosis signal is inputted from the diagnosis pattern outputter to the second register.

8. The semiconductor system containing a semiconductor device according to claim 7, further comprising:
    a controller that performs control of signal selections with respect to the first outputters and the second outputters in the plurality of circuits;
    an expectation value outputter that outputs an expectation value corresponding to the diagnosis signal; and
    a diagnoser that diagnoses whether or not the logic circuit unit as a diagnosis target is normal based on a result signal outputted, based on the diagnosis signal, by the logic circuit unit as the diagnosis target and the expectation value.

9. The semiconductor system according to claim 8, wherein when a diagnosis value based on the diagnosis signal is set in the second register, the controller performs control for causing the first outputter to select the first input signal and control with which the second input signal is selected in the second outputter, and causes the first outputter to select the second input signal and the second outputter to select the third input signal, corresponding to the diagnosis value based on the diagnosis signal which value is configured to the second register.

10. The semiconductor system according to claim 8, wherein the diagnosis pattern outputter divides and outputs the diagnosis signal to at least two second registers in the plurality of circuits in a parallel manner; and the diagnoser acquires output signals respectively from a plurality of second registers corresponding to the at least two second registers in the parallel manner.

11. The semiconductor system according to claim 6, wherein the second register is a flip-flop circuit, and when a signal inputted from the second register is selected in the second outputter, the second register functions as a shift register.

12. The semiconductor system according to claim 6, further comprising a first comparer that is connected to the first register and the second register and compares a first register value in the first register with a second register value in the second register, wherein the first comparer outputs a signal indicating non-coincidence when the first register value does not coincide with the second register value.

13. The semiconductor system according to claim 6, wherein the first outputter and the second outputter are configured of multiplexers.

14. The semiconductor system according to claim 6, wherein each of the circuit units further has a third register that is connected to a logic circuit unit in a previous stage and to which a signal is inputted from the logic circuit unit, and a second comparer that is connected to the first register and the third register and compares a first register value in the first register with a third register value in the third register, and the second comparer outputs a signal indicating non-coincidence when the first register value does not coincide with the third register value.

15. The semiconductor system according to claim 6, wherein the controller outputs a clock control signal to the first register, the second register, the first outputter, the logic circuit unit and the second outputter in each circuit unit.

* * * * *